US009911405B2

(12) United States Patent
Lee et al.

(10) Patent No.: US 9,911,405 B2
(45) Date of Patent: Mar. 6, 2018

(54) APPARATUS FOR CONTROLLING ENGINE NOISE REFLECTING ENGINE VIBRATION AND DRIVING CONDITIONS

(71) Applicants: HYUNDAI MOTOR COMPANY, Seoul (KR); KIA MOTORS CORPORATION, Seoul (KR)

(72) Inventors: Dong-Chul Lee, Anyang-si (KR); In-Soo Jung, Suwon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/377,745

(22) Filed: Dec. 13, 2016

(65) Prior Publication Data

US 2017/0330550 A1 Nov. 16, 2017

(51) Int. Cl.

*H03B 29/00* (2006.01)
*G10K 11/178* (2006.01)
*F02B 77/13* (2006.01)

(52) U.S. Cl.

CPC .......... *G10K 11/1788* (2013.01); *F02B 77/13* (2013.01); *G10K 2210/1282* (2013.01); *G10K 2210/3014* (2013.01)

(58) Field of Classification Search

CPC ....... G10K 11/1788; G10K 2210/1282; G10K 2210/3014; F02B 77/13
USPC ... 381/56, 61, 62, 63, 71.1, 71.2, 71.3, 71.4, 381/71.8, 71.9, 71.11, 73.1, 77
See application file for complete search history.

(56) References Cited

U.S. PATENT DOCUMENTS 8,416,963 B2 4/2013 Park et al.
9,177,542 B2 11/2015 Pan
2004/0170288 A1* 9/2004 Maeda .................... H04R 5/04 381/86
2006/0074645 A1* 4/2006 Tischer ................. G10K 15/02 704/226

(Continued)

FOREIGN PATENT DOCUMENTS

JP 2008230341 A 10/2008
JP 2013218079 10/2013
JP 2016521375 A 7/2016

(Continued)

OTHER PUBLICATIONS

KR Office Action dated Aug. 22, 2017, Office Action in corresponding Korean Patent Application 10-2016-0059655, dated Aug. 22, 2017; 5 pages.

*Primary Examiner* — Vivian Chin
*Assistant Examiner* — Friedrich W Fahnert
(74) *Attorney, Agent, or Firm* — Lempia Summerfield Katz LLC

(57) ABSTRACT

An apparatus for controlling engine noise reflecting engine vibration and driving conditions includes a sound generator that generates reinforcement noise in order to reinforce non-linear engine noise. The apparatus includes a vibration sensor measuring engine vibration as a noise source of the engine, a signal processing controller receiving the signal of the vibration sensor in real time and controlling the sound generator so that the engine noise may maintain linearity, and an amplifier receiving and then amplifying a control signal of the signal processing controller to transfer the amplified control signal to the sound generator.

11 Claims, 6 Drawing Sheets

(56) References Cited

U.S. PATENT DOCUMENTS

2008/0192954 A1* 8/2008 Honji .................... G10K 15/04
381/86

FOREIGN PATENT DOCUMENTS

| | | | |
|---|---|---|---|
| KR | 20100138431 | A | 12/2010 |
| KR | 20150059379 | A | 6/2015 |
| KR | 20160061069 | A | 5/2016 |
| WO | WO2006095876 | A1 | 9/2006 |

* cited by examiner

APPARATUS FOR CONTROLLING ENGINE NOISE REFLECTING ENGINE VIBRATION AND DRIVING CONDITIONS

CROSS-REFERENCE TO RELATED APPLICATION

This application claims priority to and the benefit of Korean Patent Application No. 10-2016-0059655 filed in the Korean Intellectual Property Office on May 16, 2016, which is incorporated herein by reference in its entirety.

BACKGROUND

Field of the Disclosure

The present disclosure relates to vehicle engine noise, and more particularly, to an apparatus for controlling engine noise reflecting engine vibration and driving conditions.

Description of the Related Art

Research relating to vehicle noise can be classified into research directed toward how to emit as little noise as possible from a noise source, research directed toward blocking noise with sound-absorbing materials, and research directed toward cancelling noise by active noise control. More specifically, the active noise control technology may control the noise equal to or less than a booming band via using a reverse phase sound source. Also, as the technology capable of minimizing vehicle noise, the technology may cancel noise by generating an opposite sound wave for the noise through sound equipment when the noise occurs.

The method of using sound-absorbing materials among the above technologies has shown to be effecting for high-frequency noise over 500 Hz. However, the sound-absorbing technology increases cost because the size of the sound-absorbing materials should be increased to be effective for low-frequency noise. Further, use of sound-absorbing material becomes more difficult to use or the materials may need to be varied where there is a need to reduce weight, such as for an airplane or a vehicle.

Furthermore, because recent environmental problems have become serious, there is an increasing demand for a vehicle to consume less fuel to reduce the amount of exhaust gas. As a solution to this problem, there is a desire to reduce the weight of a vehicle and increase the efficiency of an engine during use. However, this approach may inevitably have a negative impact on vibration and noise of a vehicle.

Therefore, more recently, active noise control technology and techniques have been developed. In conventional active noise control, as shown in FIG. 1, interior noise of a vehicle is sensed at a microphone 1 and is filtered through a filter 2. The filtered noise is then converted to a digital signal and applied to a controller through an analog-to-digital (AD) converter 3. The controller applies multiple algorithms to the inputted value so as to make a control signal (i.e., the control signal generating control noise having a reverse phase to the sensed noise) in order to minimize the present noise value. The control signal is then converted into an analog signal through a digital-to-analog (DA) converter. The analog control signal is then applied to an amplifier 4. Thereafter, the control signal, after being amplified by the amplifier 4, is then outputted from a speaker 6.

However, the active noise control technology is merely to reduce the interior noise of a vehicle. The technology does not reflect the needs of the driver with respect to the dynamic engine noise.

As a technique to compensate for this, there is an active sound design (ASD) technology. The ASD technology is designed to reflect the needs of the driver by pre-recording virtual sound sources, such as advanced vehicle interior noise, and reproducing the sound sources through an interior speaker while a vehicle is driven. In other words, as shown in FIG. 2, the conventional ASD system may include: a microphone 10 as a sensor for detecting noise; a control unit 30 for sensing an engine RPM, APS signal, and the like 20, depending on the noise sensed through the microphone 10 and realizing a pre-set target acceleration sound or driving sound for the entire RPM range; a selector 40 capable of selecting the acceleration sound or the driving sound; and a speaker 50 emitting the acceleration sound or the driving sound to the vehicle interior through the control unit 30.

However, the existing active noise control and active sound design technologies and techniques use the microphone to measure noise and use a speaker to generate a separate noise (the noise by a control signal or the pre-recorded virtual sound sources) in order to correspond to the noise. Thus, these technologies and techniques have a problem in that the speaker control is delayed and thus the driver may feel or sense the difference or delay.

Furthermore, the location or origin of engine noise from an engine compartment and the location or origin of the separate noise generated through the speaker are also different from each other. The speaker is mounted in the vehicle interior for the existing active noise control and active sound design systems. Thus, the driver may again feel, hear, or sense the difference.

Korea Patent Registration No. 10-1081159 (Nov. 1, 2011) discloses one such existing technology.

The foregoing is intended merely to aid in understanding the background of the present disclosure, and is not intended to mean that the present disclosure falls within the purview of the related art that is already known to those having ordinary skill in the art.

SUMMARY

The present disclosure has been made in an effort to provide an apparatus for controlling engine noise reflecting vibration characteristics of an engine. The apparatus obtains an order component of the engine vibration in real time in order to detect the vibration characteristic of the engine, maintains linearity of the engine noise depending on the vibration characteristic of the engine and controls a target sound characteristic, and generates reinforcement engine noise so as to realize the desired engine sound.

The apparatus for controlling engine noise reflecting engine vibration and driving conditions according to the present disclosure in order to achieve the above-described objects may include; a sound generator 100 for generating reinforcement noise in order to reinforce non-linear engine noise; a vibration sensor 200 for measuring engine vibration as a noise source of the engine; a signal processing controller 300 for receiving the signal of the vibration sensor 200 in real time and controlling the sound generator 100 so that the engine noise may maintain linearity; and an amplifier 400 receiving and then amplifying a control signal of the signal processing controller 300 to transfer the amplified control signal to the sound generator 100.

The sound generator 100 may be mounted inside an engine compartment.

The apparatus for controlling engine noise reflecting engine vibration and driving conditions may further include a sensor 500 for sensing driving conditions of a vehicle and then transferring a signal or information representative of the driving conditions to the signal processing controller 300.

The sensor 500 may include any one or more of an engine revolution detection unit 510, a gear stage detection unit 520 or an opening amount detection unit 530 of an accelerator pedal.

The apparatus for controlling engine noise reflecting engine vibration and driving conditions may further include a microphone 600 for sensing the engine noise reinforced by the reinforcement engine noise to maintain linearity.

The apparatus for controlling engine noise reflecting engine vibration and driving conditions may further include a proportional-integral-derivative (PID) controller 700 for controlling the sound generator 100 so that the engine noise measured by the microphone 600 may correspond to a pre-set target engine noise map.

The signal processing controller 300 may control the sound generator 100 to maintain the linearity of an order component in order to prevent the disconnection of the order component from being generated in accordance with the change of the engine vibration in the engine noise or order component according to one or more pre-set orders of the engine.

The order of the engine noise may be a proportional constant of the number of revolutions of the engine and a frequency of a crankshaft of the engine, and the one or more pre-set orders of the engine may include any one or more of a second order component, a fourth order component or an eighth order component of a plurality of order components.

A sound map with respect to the engine noise according to the engine vibration may be stored as data in the signal processing controller 300, and the signal processing controller 300 may control the sound generator 100 so that the engine noise may correspond to the sound map.

The sound map stored in the signal processing controller 300 may be a plural number, and any one sound map of the plural sound maps may be used.

The signal processing controller 300 may control the sound generator 100 so that any one or more order component of the plural order components may maintain the linearity, and may individually control the plurality of order components.

The signal processing controller 300 may control the sound generator 100 in real time in order to amplify or modulate any one or more order component of the plurality of order components.

According to the present disclosure as described above, the apparatus is able to realize immediate and natural engine noise (engine sound), reflecting the engine vibration characteristic which becomes the sound source of the engine noise.

Furthermore, even if the noise due to deterioration of a vehicle is increased, the apparatus is able to maintain the initial state of engine noise (engine sound) by using a microphone and a PID controller to reflect it.

BRIEF DESCRIPTION OF THE DRAWINGS

The above and other objects, features and advantages of the present disclosure will be more clearly understood from the following detailed description taken in conjunction with the accompanying drawings, in which.

DESCRIPTION OF PREFERRED EMBODIMENTS

Terms and words used in the present specification and claims are not necessarily to be construed as a general or dictionary meaning. Instead, the terms and words may be construed as meaning, and concepts meeting, the technical ideas of the present disclosure based on a principle that the present inventors may appropriately define the present disclosure as the concepts of terms in order to describe their disclosures. Therefore, the configurations described in the embodiments and drawings of the present disclosure are merely example embodiments but do not represent all of the technical spirit of the present disclosure. Thus, the present disclosure should be construed as including all the changes, equivalents, and substitutions included in the spirit and scope of the present disclosure at the time of filing this application. In addition, if it is determined that the detailed description on technology that may be well-known in the art and that the inclusion thereof may unnecessarily cloud the concept of the present disclosure, the detailed description thereof has been omitted herein. An embodiment of the present disclosure will hereinafter be described in detail with reference to the accompanying drawings.

Figure 1:
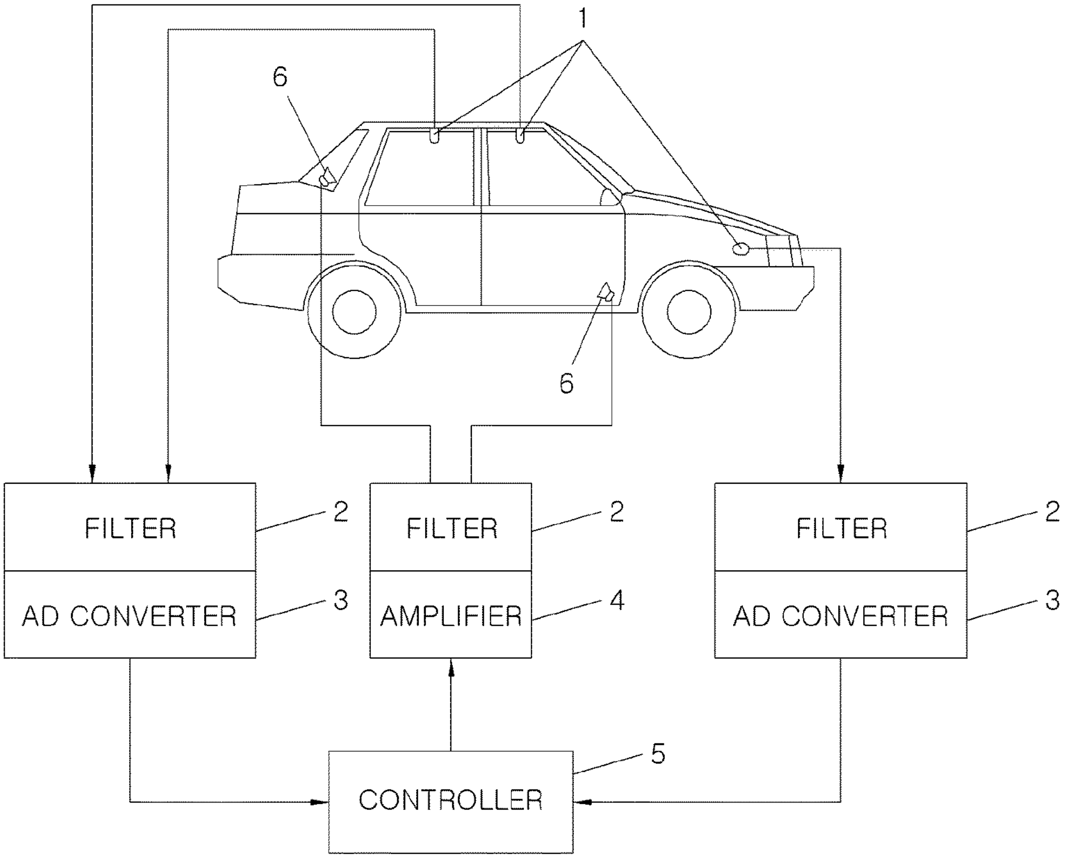
FIGS. 1 and 2 show s simplified schematic (FIG. 1) and a block diagram (FIG. 2) of prior art systems.
Figure 2:
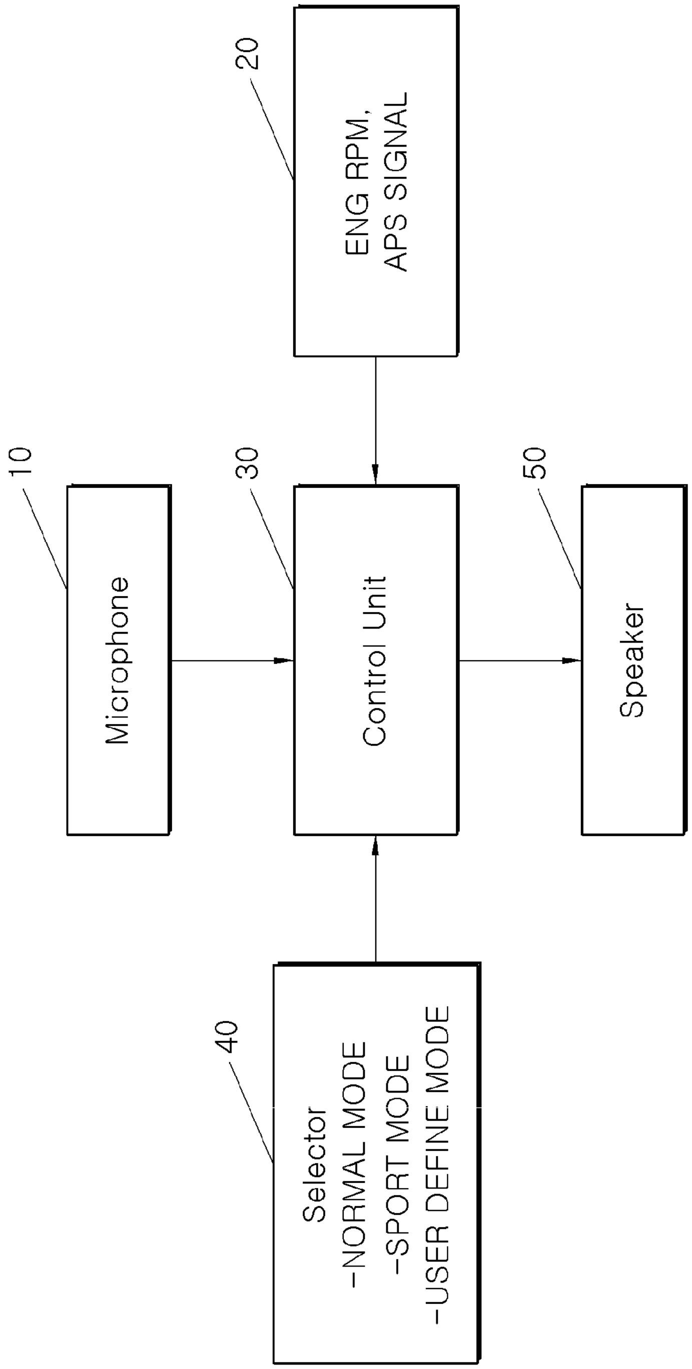
Figure 3:
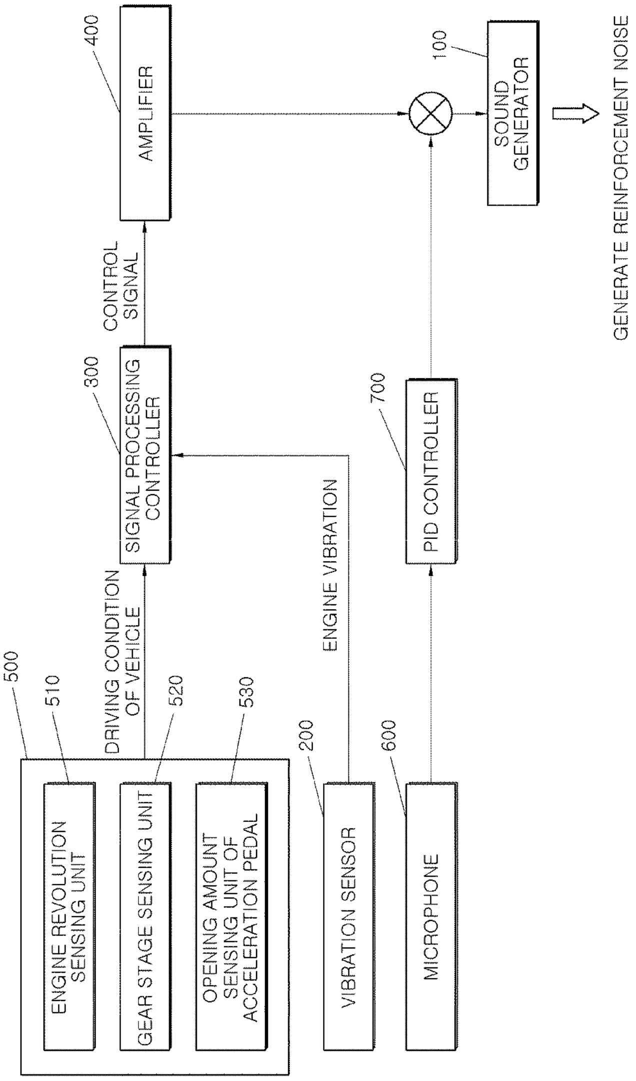
FIG. 3 is a block diagram showing an apparatus for controlling engine noise reflecting engine vibration and driving conditions according to the present disclosure.

FIG. 3 is a block diagram of an apparatus for controlling engine noise reflecting engine vibration and driving conditions according to the present disclosure. Referring to FIG. 3, an apparatus for controlling engine noise reflecting engine vibration and driving conditions according to the present disclosure may include a sound generator 100, a vibration sensor 200, a signal processing controller 300, an amplifier 400, a sensor 500, a microphone, and a proportional-integral-derivative mechanism or PID controller 700, i.e., a control loop feedback controller.

The sound generator 100 may play a role of generating reinforcement noise in order to reinforce non-linear engine noise. The sound generator 100 may be a speaker but is not to be not limited thereto, and thus may be replaced by other components capable of performing the same role depending on the intent of the designer. In this regard, the detailed description of the non-linear engine noise will be described later.

The sound generator 100 may be mounted inside an engine compartment of a vehicle. In other words, the sound generator 100 may be mounted within the location of origin of engine noise, i.e., within the engine compartment. The separate noise generated through the speaker is different from sound that will be generated by the sound generator 100 because the speaker is mounted to the vehicle interior in all the existing active noise control and active sound design systems. Therefore, for these existing systems, the driver may feel, hear, or sense of difference due to the difference of the noise generation locations of the actual engine noise and the speaker generated sound, thereby degrading the perceived quality of a vehicle.

Compared to this, by mounting the disclosed sound generator 100 inside the engine compartment in the present disclosure, the reinforcement noise generated from the sound generator 100 naturally reinforces the non-linear engine noise so that the driver may recognize the linearity of the engine noise. By this, the sound generator 100 is able to provide the driver with the dynamic engine noise (engine sound), thereby improving the perceived quality of a vehicle.

The vibration sensor 200 may play a role of measuring the vibration of the engine as a noise source of the engine noise. In contrast, the existing active noise control and active sound design systems measure the vehicle interior noise by using a microphone mounted in a vehicle interior and, as a result, generate separate noise (noise by a control signal or a recorded virtual sound source) through a speaker. This creates a potential problem in that there is a delay before the speaker control occurs, whereby the driver again may feel, hear, or sense the delay or the difference. Described in more detail, even if engine vibration, which is the source of engine noise, is changed, the prior art systems measure the engine noise through a microphone in a vehicle interior. Then such systems analyze the measured engine noise and generate the separate noise (noise by a control signal or a recorded virtual sound source) in order to correspond to the change of the engine noise. Therefore, for the driver who recognizes engine noise at the same time as the microphone, the driver may recognize that the separate noise (noise by a control signal or a recorded virtual sound source) is generated out of sync so that the driver may feel, hear, or sense the delay or difference. Due to this, the perceived vehicle quality is reduced in the mind of the driver.

Compared to these prior art systems, the present disclosure includes the vibration sensor 200 so that it is possible to measure the vibration of the engine as the sound source of the engine noise in real time, whereby the vibration sensor is able to reflect the characteristics of the engine vibration, which is the source of engine noise, thereby realizing immediate and natural engine noise (engine sound).

The signal processing controller 300 may receive the signal of the vibration sensor 200 in real time. The signal processing controller 300 may then play a role of controlling the sound generator 100 in order that the engine noise may maintain the linearity. Described in more detail, the signal processing controller 300 is configured and provided to control the sound generator 100 to maintain the linearity of an order component of the engine noise. This is done in order to prevent the order component from being generated in accordance with the change of the engine vibration in the engine noise (order component) depending on one or more pre-set orders of the engine.

In this regard, the order of the engine noise means a proportional constant of a revolution (rpm) and a frequency of a crankshaft. The one or more pre-set orders of the engine may include at least any one of a second order component, a fourth order component or an eighth order component. That is, the order of the engine noise is an index indicating how many times the crankshaft rotates per second, and can be expressed by the following equation 1.

$$\text{Order}=\text{Crankshaft Rotation Frequency}/(\text{Engine RPM}/60\text{ sec.}) \quad \text{[EQUATION 1]}$$

Furthermore, the second order component is the engine noise due to the order when the crankshaft makes two turns. Likewise, the fourth order component is the engine noise due to the order when the crankshaft makes four turns and the eighth order component is the engine noise due to the order when the crankshaft makes eight turns. The reason that one or more pre-set order components of the engine, as described above, include the second order component, the fourth order component and the eighth order component is because the second order component, the fourth order component and the eighth order component will be in the low frequency range and will thus have a large impact on the engine noise.

That is, the engine noise being recognized by the driver is the harmonized noise of various order components. Thus, the present disclosure considers the second order component, the fourth order component, and the eighth order component as low-frequency components as having a large influence among the various order components. However, the present disclosure is not limited thereto and may further include various order components depending on the intent of the designer or the like.

Furthermore, the signal processing controller 300 may, in real time, control a combination (that is, the engine noise harmonized by the order components) of order components that determining engine noise or sound characteristics.

In other words, the signal processing controller 300 is able to control the sound generator 100 to control the plural order components individually so that any one or more order components (particularly, low frequency components having a large influence on determining engine sound characteristics) among the plural order components may maintain the linearity in the engine noise. That is, the signal processing controller 300 is configured and provided to control the sound generator 100 in order to amplify or modulate any one or more order components among the plural order components.

Described in more detail, the signal processing controller 300 may control the plural order components individually in order to provide driver with the engine sound to correspond to vehicle characteristics. For example, the present disclosure may control the plural order components individually in real time in order that only the second order component among the plural order components may maintain the linearity. In such an embodiment, the signal processing controller 300 may not perform any additional control even if a disconnection of the other order components (the fourth order component, the eighth order component, and so on) occurs.

Figure 4A:
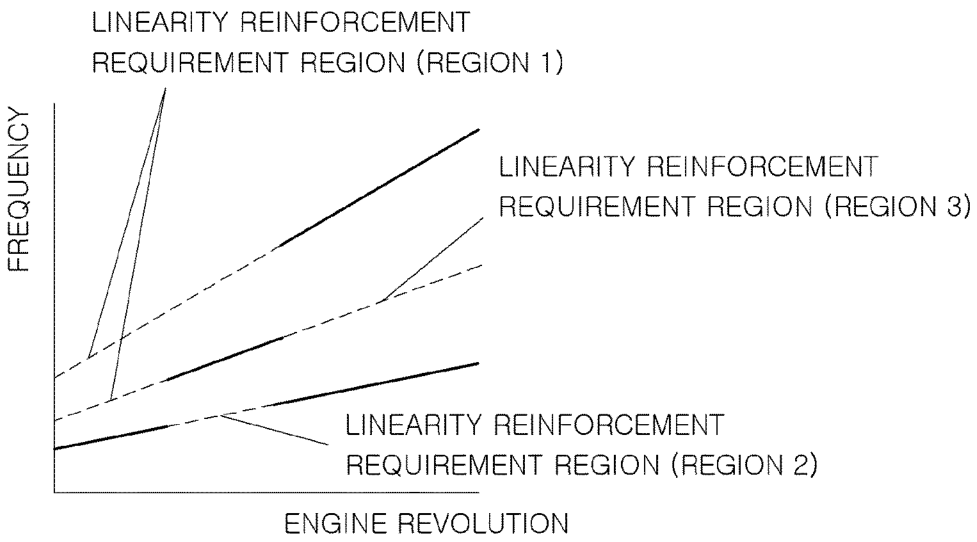
FIG. 4(*a*) and FIG. 4(*b*) are charts illustrating effects of the present disclosure.
Figure 4B:
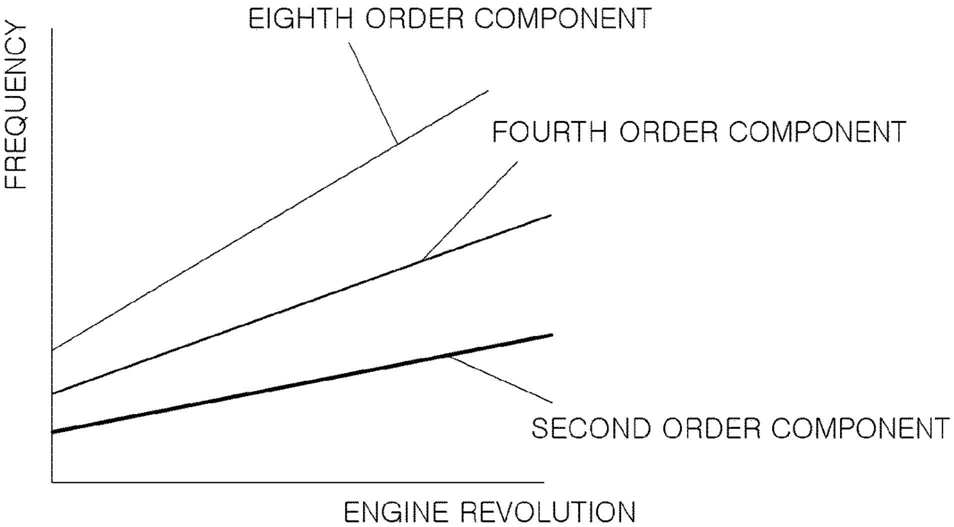

Hereinafter, referring to FIGS. 4(*a*), 4(*b*) and 5, reinforcing of the non-linear engine noise and the linear engine noise will be described. Referring to FIGS. 4(*s*) and 4(*b*), the second order component, the fourth order component and the eighth order component are shown, respectively. As one will see, the disconnection occurs in each order component in the FIG. 4(*a*).

More specifically, in FIG. 4(*a*), the region where the disconnection has occurred is shown immediately after starting (region 1). The region where the disconnection has occurred after starting and then, after a certain time passes is also shown (region 2). The region where the disconnection has occurred after a certain time passes and then, starting off or accelerating (region 3) is also shown.

The disconnection may occur upon a sudden change of the vibration of the engine as the sound source of the engine noise. The sudden change may be caused by a change in driving conditions of a vehicle, such as upon a gear shift, rapid acceleration, and the like. Furthermore, if the disconnection occurs, the harmonized engine noise (engine noise harmonized with the second, fourth and eighth order components) that is recognized to the driver is also rapidly changed, thereby causing discomfort to the driver.

In order to prevent this, the signal processing controller 300 may receive the signal of the vibration sensor 200 in real time, and recognize whether the vibration of the engine is suddenly changed or not. Furthermore, recognizing the above-mentioned change in engine vibration, the signal processing controller 300 may control the sound generator 100 to generate the reinforcement noise. In this regard, the generated noise may be configured to play a role of filling the area where the above-mentioned disconnection occurs. By doing so, the signal processing controller 300 is configured to prevent the disconnection of the order component from being generated in accordance with the change of the engine vibration in the engine noise (order component) according to the one or more pre-set engine orders. In other words, the signal processing controller 300 may play a role of controlling the sound generator 100 in order that the harmony engine noise (the engine noise harmonized with the second, fourth and eighth order components) may maintain the linearity.

Furthermore, a sound map with respect to the engine noise by the engine vibration) may be stored as data in the signal processing controller 300. The signal processing controller 300 may control the sound generator 100 in order that the engine noise may correspond to the stored data of the sound map.

That is, the sound map includes data that is pre-stored and set in order to correspond to a type (for example, sports car or sedan) of a vehicle. Accordingly, in the case where the engine noise maintaining the linearity, as above, is not corresponded, i.e., matched or compared to the pre-stored data and set sound map, the sound generator 100 may be controlled to generate additional reinforcement noise, thereby increasing the driver's satisfaction with respect to the engine sound to improve the perceived quality of a vehicle.

The sound map may include various alternative sound maps such as a dynamic sound map (for example: a sound map for a sports car) and a quiet sound map (for example: a sound map for a luxury sedan), and the like. However, the one or more stored data sets or sound maps are not limited to these or any other particular examples, and can be additionally set by the designer. Furthermore, the sound maps may be stored in the signal processing controller 300, and any one sound map among the sound maps, depending on the designer's intentions for a vehicle type, is set to be used.

Therefore, the apparatus for controlling engine noise reflecting engine vibration and driving conditions may be used and installed regardless of the vehicle type. The apparatus may be configured or set to use any one sound map, depending on the vehicle type before delivering a vehicle.

The amplifier 400 may play a role of receiving and amplifying the control signal of the signal processing controller 300 in order to transfer the amplified control signal to the sound generator 100.

The sensor 500 may detect the driving conditions of a vehicle and then transfer driving condition information to the signal processing controller 300. The sensor 500 may include any one or more of an engine revolution sensing unit 510, a gear stage detection unit 520 or an opening amount detection unit 530 for detecting a position or movement of an accelerator pedal. In other words, the sensor 500 may detect driving conditions of a vehicle such as an engine revolutions or RPMs, a gear stage or an opening amount of an accelerator pedal, and then, transfer signals or information corresponding to such detected driving conditions to the signal processing controller 300.

Accordingly, the signal processing controller 300 may more accurately prevent the disconnection of the order component from being generated by considering driving conditions of a vehicle such as an engine vibration via the vibration sensor 200, an engine revolution or RPM state, a gear stage and/or shift or an opening amount of an accelerator pedal.

The microphone 600 may be mounted in a vehicle interior and play a role of detecting the engine noise as perceived in the interior of the vehicle and which has been reinforced by the reinforcement engine noise, in order to maintain the linearity. The PID controller 700 may play a role of controlling the sound generator 100 in order that the engine noise measured from the microphone 600 and as perceived in the vehicle interior may be corresponded, i.e., matched or compared to the pre-set target engine sound map.

Described in more detail, the engine noise flowing into the vehicle may be increased due to aging of the vehicle or the like. As long as the non-linear engine noise is not reinforced, the driver may feel displeasure due to the increase in the engine noise itself, thereby reducing the perceived quality of a vehicle.

Therefore, in the present disclosure, by detecting the engine noise in the vehicle interior through use of the microphone 600 mounted in the vehicle interior, the PID controller 700 may control the sound generator 100 in order that the engine noise may correspond to the pre-set target engine sound map. For example, in order to offset the engine noise, the sound generator 100 may be controlled so that the reinforcement noise is generated having a reverse phase with respect to the engine noise.

Figure 5:
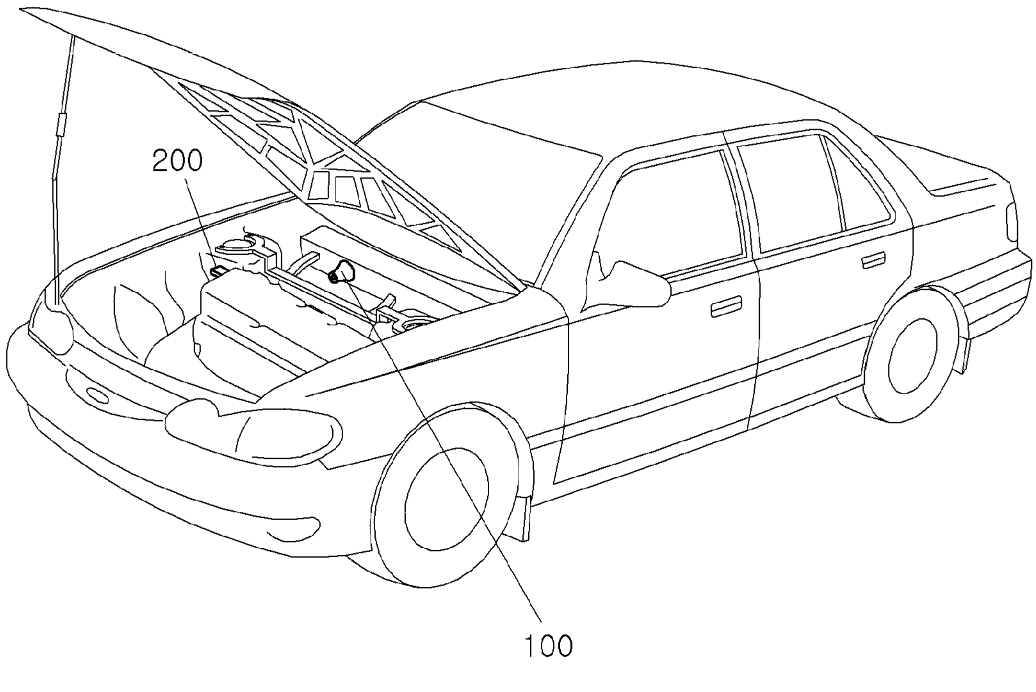
FIG. 5 shows a state diagram of the present disclosure as applied to a vehicle.

FIGS. 4(*a*) and 4(*b*) are charts for explaining the effects of the present disclosure. FIG. 5 shows a state diagram of the present disclosure as it may be applied to a vehicle. Referring to FIG. 4(*a*), one is able to confirm that the disconnection occurs in each order component in the case of a vehicle to which the present disclosure is not applied. Accordingly, the engine noise (the engine noise harmonized with the second, fourth and eighth order components) recognized by the driver is rapidly changed, thereby causing discomfort to displeasure for the driver.

Compared to this, referring to FIG. 4(*b*), the area where the disconnection of each order component occurred is filled by the reinforcing noise due to the reinforcing noise in the case of a vehicle applying the present disclosure. As a result, one is able to confirm that the engine noise (the engine noise harmonized with the second, fourth and eighth order components) recognized by the driver maintains the linearity. Therefore, the present disclosure may provide the driver with the dynamic engine noise (engine sound), thereby improving the perceived quality of a vehicle.

The embodiment as discussed previously is merely one example embodiment which may enable a person of ordinary skill in the art (hereinafter referred to as 'a skilled person in the relevant technology'), who has a typical knowledge in a technology field to which the present disclosure belongs, to execute the present disclosure. However, the present disclosure is not limited to the aforesaid embodiment and the attached drawings, and hence the disclosed embodiment does not result in limiting the scope of right in this disclosure. Therefore, it will be apparent to a skilled person in the relevant technology that transpositions, transformations, and changes are possible within the scope of the present disclosure and it will be apparent to a skilled person in the relevant technology that such changes are included within the scope of right in the present disclosure as well.

What is claimed is:

1. An apparatus for controlling engine noise reflecting engine vibration and driving conditions, the apparatus comprising: a sound generator that generates reinforcement noise in order to reinforce non-linear engine noise; a vibration sensor that measures engine vibration as a noise source of the engine noise; a signal processing controller that receives a signal of the vibration sensor in real time and that controls the sound generator so that the engine noise may maintain linearity; and an amplifier that receives and then amplifies a control signal of the signal processing controller and then transfers the control signal to the sound generator, wherein the signal processing controller controls the sound generator to maintain a linearity of an order component of the engine noise in order to prevent a disconnection of the order component from being generated in accordance with a change of the engine vibration in the engine noise or the order component according to one or more pre-set orders of the engine.

2. The apparatus of claim 1, wherein the sound generator is mounted inside an engine compartment.

3. The apparatus of claim 1, further comprising a sensor that senses driving conditions of a vehicle and then transfers information representative of the driving conditions to the signal processing controller.

4. The apparatus of claim 3, wherein the sensor comprises any one or more of an engine revolution detection unit, a gear stage detection unit or an opening amount detection unit of an accelerator pedal.

5. The apparatus of claim 1, further comprising a microphone that senses the engine noise reinforced by the reinforcement engine noise to maintain linearity.

6. The apparatus of claim 5, further comprising a proportional-integral-derivative (PID) controller that controls the sound generator so that the engine noise measured by the microphone is corresponded to a pre-set target engine noise map.

7. The apparatus of claim 1, wherein the order of the engine noise is a proportional constant of a number of engine revolutions and a frequency of a crankshaft of the engine, and the one or more pre-set order components of the engine comprises any one or more of a second order component, a fourth order component or an eighth order component.

8. The apparatus of claim 1, wherein a sound map with respect to the engine noise according to the engine vibration is stored as data in the signal processing controller, and the signal processing controller controls the sound generator so that the engine noise may correspond to the sound map.

9. The apparatus of claim 8, wherein the sound map stored in the signal processing controller includes a plurality of different sound maps, and any one sound map of the plurality of different sound maps is used.

10. The apparatus of claim 1, wherein the signal processing controller controls the sound generator so that any one or more order component of the plurality of order components may maintain the linearity, and may individually control the plurality of order components.

11. The apparatus of claim 10, wherein the signal processing controller controls the sound generator in real time in order to amplify or modulate any one or more order component of the plurality of order components.

* * * * *